United States Patent
Kameno

(10) Patent No.: US 11,899,079 B2
(45) Date of Patent: Feb. 13, 2024

(54) MAGNETIC SENSOR AND ITS MANUFACTURING METHOD

(71) Applicant: TDK Corporation, Tokyo (JP)

(72) Inventor: Makoto Kameno, Tokyo (JP)

(73) Assignee: TDK CORPORATION, Tokyo (JP)

( * ) Notice: Subject to any disclaimer, the term of this patent is extended or adjusted under 35 U.S.C. 154(b) by 176 days.

(21) Appl. No.: 17/433,196

(22) PCT Filed: Feb. 10, 2020

(86) PCT No.: PCT/JP2020/005042
§ 371 (c)(1),
(2) Date: Aug. 23, 2021

(87) PCT Pub. No.: WO2020/175119
PCT Pub. Date: Sep. 3, 2020

(65) Prior Publication Data
US 2022/0137157 A1     May 5, 2022

(30) Foreign Application Priority Data
Feb. 25, 2019   (JP) .................................. 2019-031226

(51) Int. Cl.
*G01R 33/09*  (2006.01)
*G01R 33/00*  (2006.01)

(52) U.S. Cl.
CPC ...... *G01R 33/0011* (2013.01); *G01R 33/0005* (2013.01); *G01R 33/09* (2013.01)

(58) Field of Classification Search
CPC . G01R 33/0005; G01R 33/0011; G01R 33/09
See application file for complete search history.

(56) References Cited

U.S. PATENT DOCUMENTS

2018/0313907 A1* 11/2018 Fukui ..................... G01R 33/09
2021/0003642 A1*  1/2021 Tanabe ................... H05K 3/305

FOREIGN PATENT DOCUMENTS

EP     3 376 244 A1     9/2018
JP     2017-090192 A    5/2017
(Continued)

OTHER PUBLICATIONS

International Search Report issued in International Application No. PCT/JP2020/005042, dated Apr. 21, 2020 w/English Translation.
(Continued)

*Primary Examiner* — Alesa Allgood
(74) *Attorney, Agent, or Firm* — Rimon P.C.; Tomoki Tanida

(57) ABSTRACT

An object of the present invention is to provide a magnetic sensor capable of, while suppressing an increase in manufacturing cost, controlling the gap size so as to make the gap between the element formation surface of the sensor chip and the magnetism collecting member as small as possible and to make variations among products fall within a certain range and a manufacturing method for such a magnetic sensor. A magnetic sensor includes a sensor chip 20a mounted on a substrate 2 such that the element formation surface 20a is perpendicular to the substrate 2 and a magnetism collecting member 30 mounted on the substrate 2 such that the surface 31 faces the substrate 2 and the surface 32 faces the element formation surface 20a. The surfaces 31 and 32 of the magnetism collecting member 30 have flatness higher than that of the other surfaces thereof.

8 Claims, 6 Drawing Sheets

(56) References Cited

FOREIGN PATENT DOCUMENTS

JP  2018-194393 A  12/2018
WO  2018/212131 A1  11/2018

OTHER PUBLICATIONS

Extended European Search Report issued in corresponding European Patent Application No. 20763035.1-1212, dated Oct. 21, 2022.

* cited by examiner

MAGNETIC SENSOR AND ITS MANUFACTURING METHOD

CROSS REFERENCE TO RELATED APPLICATIONS

This application is the U.S. National Phase under 35 U.S.C. § 371 of International Application No. PCT/JP2020/005042, filed on Feb. 10, 2020, which claims the benefit of Japanese Application No. 2019-031226, filed on Feb. 25, 2019, the entire contents of which are hereby incorporated by reference.

TECHNICAL FIELD

The present invention relates to a magnetic sensor and its manufacturing method and, more particularly, to a magnetic sensor including a sensor chip and a magnetism collecting member which are mounted on the surface of a substrate and its manufacturing method.

BACKGROUND ART

Magnetic sensors are widely used for ammeters, magnetic encoders, and the like. Magnetic sensors are sometimes provided with a magnetism collecting member for collecting magnetic flux in a sensor chip so as to enhance its detection sensitivity. For example, Patent Document 1 discloses a magnetic sensor including a sensor chip mounted on a substrate such that an element formation surface thereof is perpendicular to the substrate and a magnetism collecting member mounted on the substrate such that the end portion thereof faces the element formation surface.

In the magnetic sensor described in Patent Document 1, the sensor chip is mounted on the substrate in a state of being laid at 90° such that the element formation surface is perpendicular to the substrate, so that even a long magnetism collecting member can be stably held on the substrate.

CITATION LIST

[Patent Document]
[Patent Document 1] JP 2017-090192A

SUMMARY OF THE INVENTION

Problem to be Solved by the Invention

However, if the magnetism collecting member has low machining accuracy, a slight gap may be generated between the element formation surface of the sensor chip and the magnetism collecting member due to imperfect contact therebetween. This gap significantly affects magnetic detection sensitivity and thus should preferably be as small as possible. Further, it is desirable to control the gap size such that variations among products fall within a certain range.

To control the gap size so as to make the gap between the element formation surface of the sensor chip and the magnetism collecting member as small as possible and to make variations among products fall within a certain range, a method is available in which the surfaces of the magnetism collecting member is ground or polished to enhance flatness of the surfaces and to make the angle formed by two adjacent surfaces as close to 90° as possible.

However, grinding or polishing all the surfaces of the magnetism collecting member unnecessarily increases the manufacturing cost of the magnetic sensor.

It is therefore an object of the present invention to provide a magnetic sensor capable of, while suppressing an increase in manufacturing cost, controlling the gap size so as to make the gap between the element formation surface of the sensor chip and the magnetism collecting member as small as possible and to make variations among products fall within a certain range and a manufacturing method for such a magnetic sensor.

Means for Solving the Problem

A magnetic sensor according to the present invention includes: a substrate; a sensor chip provided with an element formation surface having a magnetosensitive element formed thereon and mounted on the surface of the substrate such that the element formation surface is perpendicular to the surface of the substrate; and a magnetism collecting member mounted on the surface of the substrate such that the first surface thereof faces the surface of the substrate and the second surface thereof faces the element formation surface of the sensor chip. The first and second surfaces of the magnetism collecting member have flatness higher than that of at least one of the other surfaces of the magnetism collecting member.

According to the present invention, the first and second surfaces of the magnetism collecting member have high flatness, so that it is possible to control the gap size between the element formation surface of the sensor chip and the magnetism collecting member so as to reduce the gap as much as possible and to make variations among products fall within a certain range. Further, at least one of the other surfaces than the first and second surfaces of the magnetism collection member need not be improved in terms of flatness, so that unnecessary manufacturing cost for machining the surfaces is not incurred. This can prevent an increase in manufacturing cost.

In the present invention, the magnetism collecting member may have a third surface, the sensor chip and magnetism collecting member may be fixed to each other through an adhesive applied on the sensor chip and the third surface of the magnetism collecting member, and the flatness of the first and second surfaces may be higher than that of the third surface. This eliminates unnecessary manufacturing cost for machining the third surface. Further, the flatness of the third surface is low, so that adhesive strength of the adhesive can sufficiently be ensured.

In the present invention, the magnetism collecting member may further have a fourth surface, the substrate and the magnetism collecting member may be fixed to each other through an adhesive applied on the surface of the substrate and the fourth surface of the magnetism collecting member, and the flatness of the first and second surfaces may be higher than that of the fourth surface. This eliminates unnecessary manufacturing cost for machining the fourth surface. Further, the flatness of the fourth surface is low, so that a sufficient adhesive strength of the adhesive can be ensured.

In the present invention, the magnetism collecting member may be made of a ferrite material. Although flatness of the ferrite material is low immediately after being cut, but flatness of the first and second surfaces thereof can be selectively enhanced by grinding or polishing.

A manufacturing method for a magnetic sensor according to the present invention includes: a first step of cutting out a magnetism collecting member from a block made of a magnetic material; a second step of selectively grinding or polishing first and second surfaces of the magnetism collecting member to selectively enhance flatness of the first and second surfaces; a third step of mounting a sensor chip on the surface of a substrate such that an element formation surface of the sensor chip having a magnetosensitive element formed thereon is perpendicular to the surface of the substrate; and a fourth step of mounting the magnetism collecting member on the surface of the substrate such that the first surface faces the surface of the substrate and the second surface faces the element formation surface of the sensor chip.

According to the present invention, the first and second surfaces of the magnetism collecting member are selectively ground or polished, so that it is possible to enhance flatness of the first and second surfaces and to minimize an increase in manufacturing cost involved in grinding or polishing.

In the present invention, the fourth step may be performed with the magnetism collecting member biased so as to press the second surface of the magnetism collecting member against the element formation surface of the sensor chip. This can reduce a gap between the element formation surface of the sensor chip and the magnetism collecting member as much as possible.

In the present invention, the magnetism collecting member may have a third surface, grinding or polishing may be applied to the first and second surfaces but not to the third surface in the second step, and an adhesive may be applied on the sensor chip and the third surface of the magnetism collecting member in the fourth step. This eliminates unnecessary manufacturing cost for machining the third surface. Further, the flatness of the third surface is low, so that a sufficient adhesive strength of the adhesive can be ensured.

In the present invention, the magnetism collecting member may further have a fourth surface, grinding or polishing may be applied to the first and second surfaces but not to the fourth surface in the second step, and an adhesive may be applied on the surface of the substrate and the fourth surface of the magnetism collecting member in the fourth step. This eliminates unnecessary manufacturing cost for machining the fourth surface. Further, the flatness of the fourth surface is low, so that a sufficient adhesive strength of the adhesive can be ensured.

Advantageous Effects of the Invention

As described above, according to the present invention, it is possible to, while suppressing an increase in manufacturing cost, controlling the size of the gap so as to make the gap between the element formation surface of the sensor chip and the magnetism collecting member as small as possible and to make variations among products fall within a certain range.

MODE FOR CARRYING OUT THE INVENTION

Preferred embodiments of the present invention will be explained below in detail with reference to the accompanying drawings.

Figure 1:
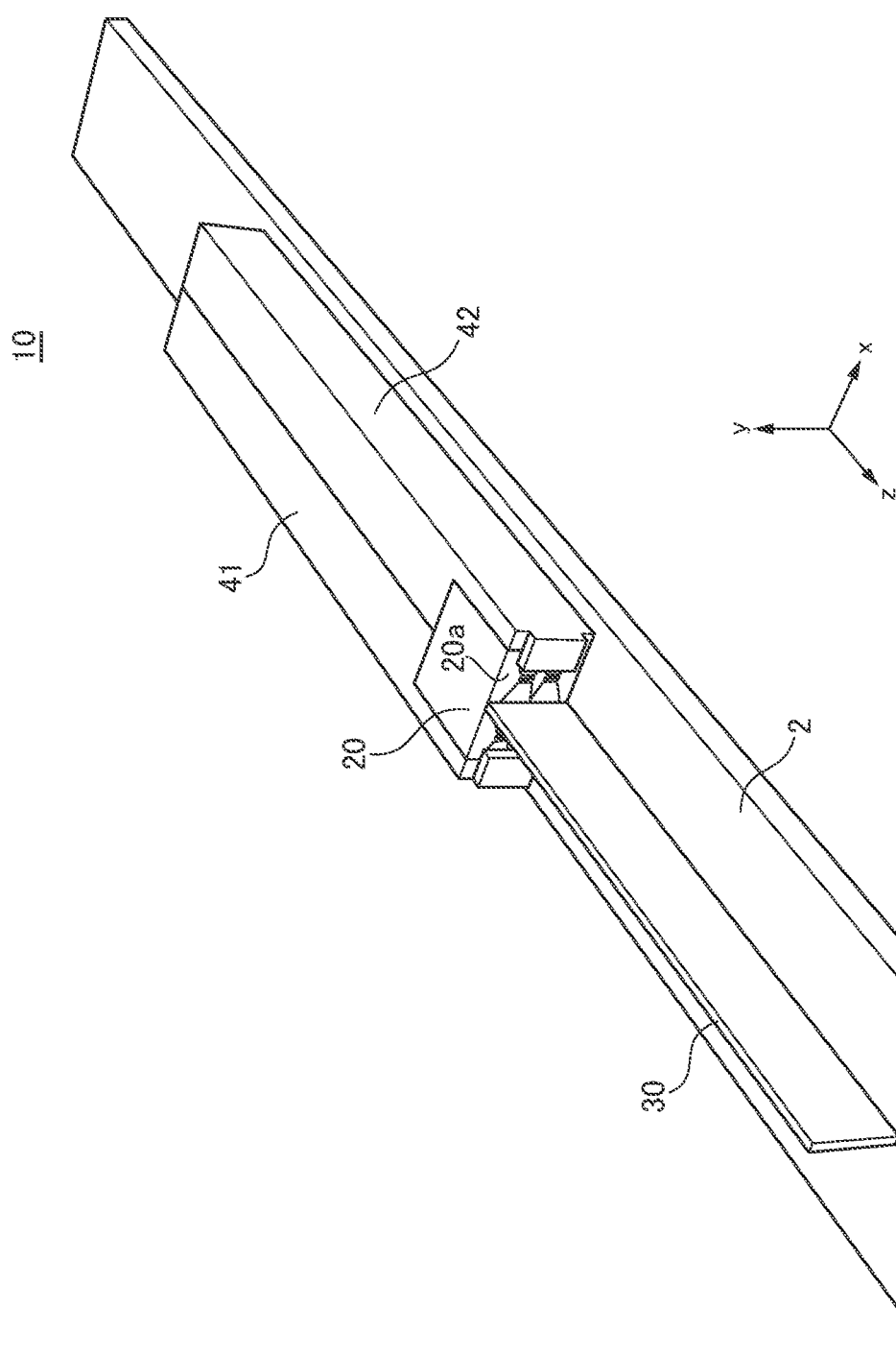
FIG. 1 is a schematic perspective view illustrating the outer appearance of a magnetic sensor 10 according to a preferred embodiment of the present invention.

FIG. 1 is a schematic perspective view illustrating the outer appearance of a magnetic sensor 10 according to a preferred embodiment of the present invention.

As illustrated in FIG. 1, the magnetic sensor 10 according to the present embodiment includes a substrate 2 whose surface constitutes the xz plane, a sensor chip 20, and magnetism collecting members 30, 41, and 42. The sensor chip 20 and magnetism collecting members 30, 41, and 42 are placed on the surface of the substrate 2. The sensor chip 20 has an element formation surface 20a constituting the xy plane, and one end of the magnetism collecting member 30 in the z-direction and the element formation surface 20a face each other. The magnetism collecting members 41 and 42 are provided on the back surface side of the sensor chip 20. The magnetism collecting members 30, 41, and 42 are each a block made of a soft magnetic material having a high permeability, such as ferrite.

As illustrated in FIG. 1, in the present embodiment, the sensor chip 20 is mounted such that the element formation surface 20a of the sensor chip 20 is perpendicular to the surface of the substrate 2. That is, the sensor chip 20 is mounted in a state of being laid at 90° with respect to the substrate 2. Thus, even when the magnetism collecting member 30 is long in the z-direction, it can be stably fixed to the substrate 2.

Figure 2:
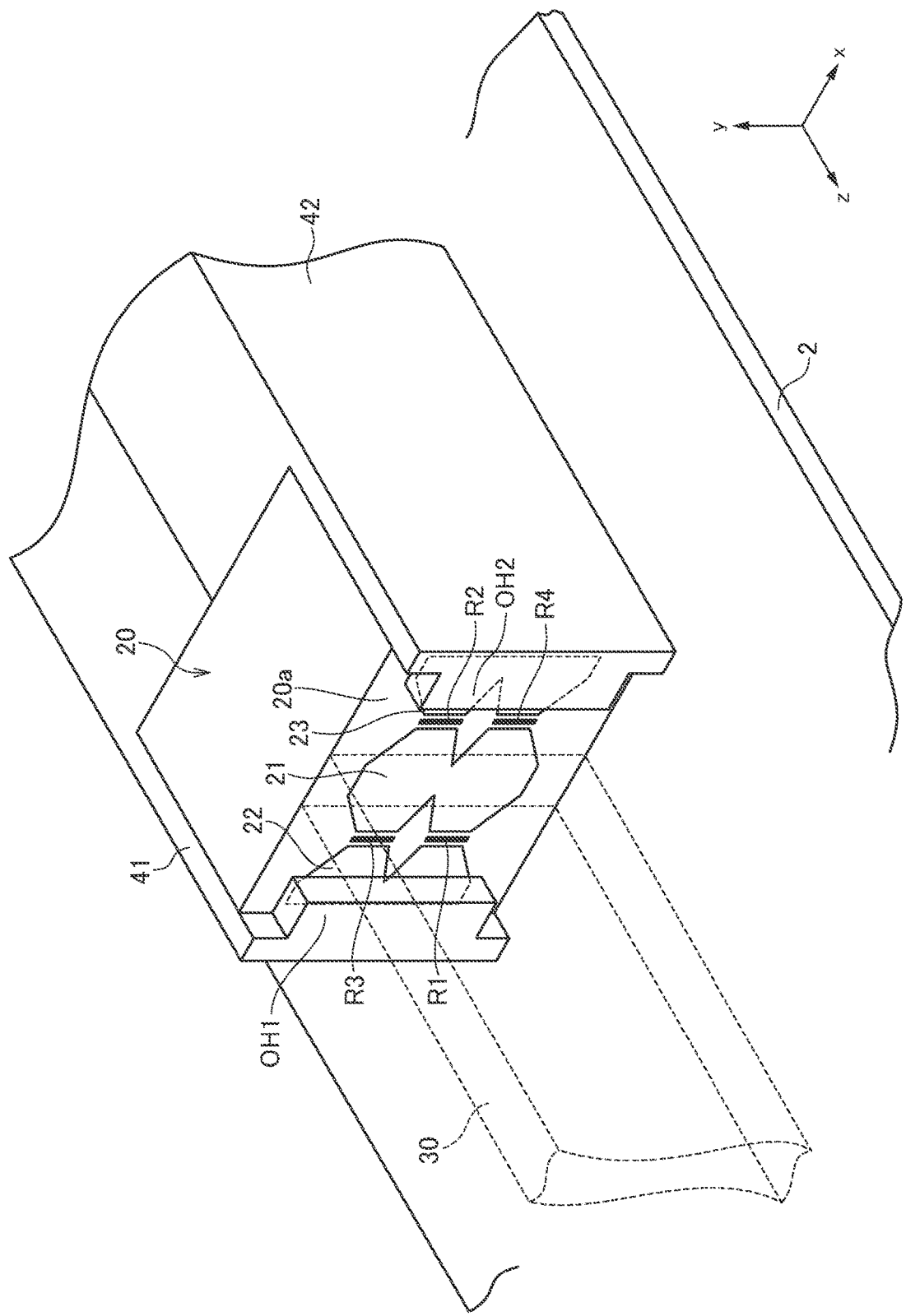
FIG. 2 is a schematic perspective view for explaining the structure of the element formation surface 20a of the sensor chip 20.

FIG. 2 is a schematic perspective view for explaining the structure of the element formation surface 20a of the sensor chip 20.

As illustrated in FIG. 2, the sensor chip 20 has a substantially rectangular parallelepiped shape and has four magnetosensitive elements R1 to R4 on the element formation surface 20a constituting the xy plane. The magnetosensitive elements R1 to R4 are not particularly limited in type as long as the characteristics thereof change according to the direction or strength of a magnetic field and may be, for example, magnetoresistive elements. In the following description, the magnetosensitive elements R1 to R4 are assumed to be magnetoresistive elements and to have the same fixed magnetization direction. The magnetosensitive elements R1 and R3 are at the same x-direction position, and the magnetosensitive elements R2 and R4 are at the same x-direction position. Further, the magnetosensitive elements R1 and R4 are at the same y-direction position, and the magnetosensitive elements R2 and R3 are at the same y-direction position.

Magnetic layers 21 to 23 are formed on the element formation surface 20a of the sensor chip 20. The magnetic layer 21 is positioned at substantially the center on the element formation surface 20a in a plan view, and the magnetic layers 22 and 23 are positioned on both sides of the magnetic layer 21 in the x-direction. Although not particularly limited, the magnetic layers 21 to 23 each may be a film made of a composite magnetic material obtained by dispersing magnetic filler in a resin material or may be a thin film or a foil made of a soft magnetic material, such as nickel or permalloy, or may be a thin film or a bulk sheet made of ferrite or the like. The magnetosensitive elements R1 and R3 are disposed in a gap between the magnetic layers 21 and 22, and the magnetosensitive elements R2 and R4 are disposed in a gap between the magnetic layers 21 and 23.

The magnetism collecting member 30 is disposed between the magnetosensitive elements R1, R3 and the magnetosensitive elements R2, R4 in a plan view, namely, as viewed in the z-direction and has a rectangular parallelepiped shape elongated in the z-direction. The magnetism collecting member 30 collects magnetic flux in the z-direction and splits the collected magnetic flux into both sides thereof in the x-direction on the element formation surface 20a. The height of the magnetism collecting member 30 in the z-direction is not particularly limited; however, when the height thereof is increased, selectivity with respect to magnetic flux in the z-direction can be improved. In the present embodiment, the width of the magnetism collecting member 30 in the y-direction substantially coincides with the width of the sensor chip 20 in the y-direction, but not limited to this.

One side surface of the sensor chip 20 and a half of the back surface thereof are covered with the magnetism collecting member 41. Similarly, the other side surface of the sensor chip 20 and the other half of the back surface thereof are covered with the magnetism collecting member 42. Although the magnetism collecting members 41 and 42 may not necessarily be provided in the present invention, the presence of the magnetism collecting members 41 and 42 can further improve selectivity with respect to the magnetic flux in the z-direction. The magnetism collecting members 41 and 42 are extended in the z-direction so as to go over the element formation surface 20a in the z-direction and have overhung parts OH1 and OH2 bent toward the element formation surface 20a side from the extended part.

Thus, as viewed in the z-direction, the magnetosensitive elements R1 and R3 are positioned between the magnetism collecting member 30 and the overhung part OH1 of the magnetism collecting member 41, and the magnetosensitive elements R2 and R4 are positioned between the magnetism collecting member 30 and the overhung part OH2 of the magnetism collecting member 42. It follows that magnetic flux collected by the magnetism collecting member 30 is substantially evenly distributed to both sides of the magnetism collecting member 30 in the x-direction and then absorbed into the magnetism collecting members 41 and 42 through the overhung parts OH1 and OH2. At this time, a part of the magnetic flux passes through the magnetosensitive elements R1 to R4. That is, magnetic fluxes in mutually opposite directions are applied to the magnetosensitive elements R1, R3 and magnetosensitive elements R2, R4.

Figure 3:
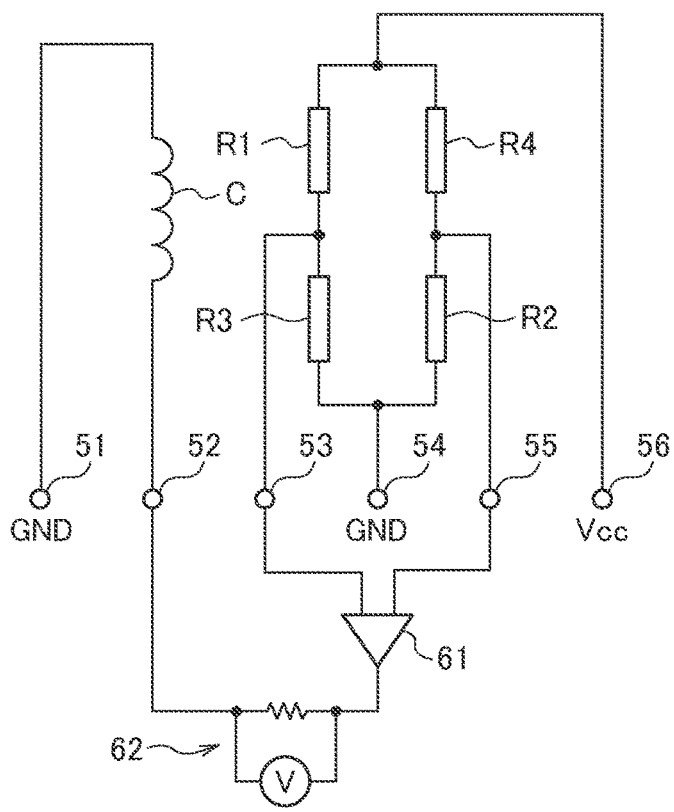
FIG. 3 is a circuit diagram for explaining the connection relation between the magnetosensitive elements R1 to R4.

FIG. 3 is a circuit diagram for explaining the connection relation between the magnetosensitive elements R1 to R4.

As illustrated in FIG. 3, the magnetosensitive element R1 is connected between the terminal electrodes 53 and 56, the magnetosensitive element R2 is connected between the terminal electrodes 54 and 55, the magnetosensitive element R3 is connected between the terminal electrodes 53 and 54, and the magnetosensitive element R4 is connected between the terminal electrodes 55 and 56. The terminal electrode 56 is applied with a power supply potential Vcc, and the terminal electrode 54 is applied with a ground potential GND. The magnetosensitive elements R1 to R4 have the same fixed magnetization direction, and a difference occurs between the resistance variation of the magnetosensitive elements R1, R3 positioned at one side as viewed from the magnetism collecting member 30 and the resistance variation of the magnetosensitive elements R2, R4 positioned at the other side as viewed from the magnetism collecting member 30. As a result, the magnetosensitive elements R1 to R4 constitute a differential bridge circuit, and thus a change in electrical resistance of the magnetosensitive elements R1 to R4 according to a magnetic flux density appears in the terminal electrodes 53 and 55.

Differential signals output from the terminal electrodes 53 and 55 are input to a differential amplifier 61 provided on or outside the substrate 2. An output signal from the differential amplifier 61 is fed back to the terminal electrode 52. As illustrated in FIG. 3, a compensation coil C is connected between the terminal electrodes 51 and 52 and thus generates a magnetic field according to the output signal from the differential amplifier 61. The compensation coil C can be integrated in the sensor chip 20. Thus, when a change in electric resistance of the magnetosensitive elements R1 to R4 according to a magnetic flux density appears in the terminal electrodes 53 and 55, a current corresponding to the magnetic flux flows in the compensation coil C to generate magnetic flux in the opposite direction, whereby the external magnetic flux is canceled. Then, by converting the current output from the differential amplifier 61 into voltage using a detection circuit 62, the strength of the external magnetic flux can be detected.

Figure 4:
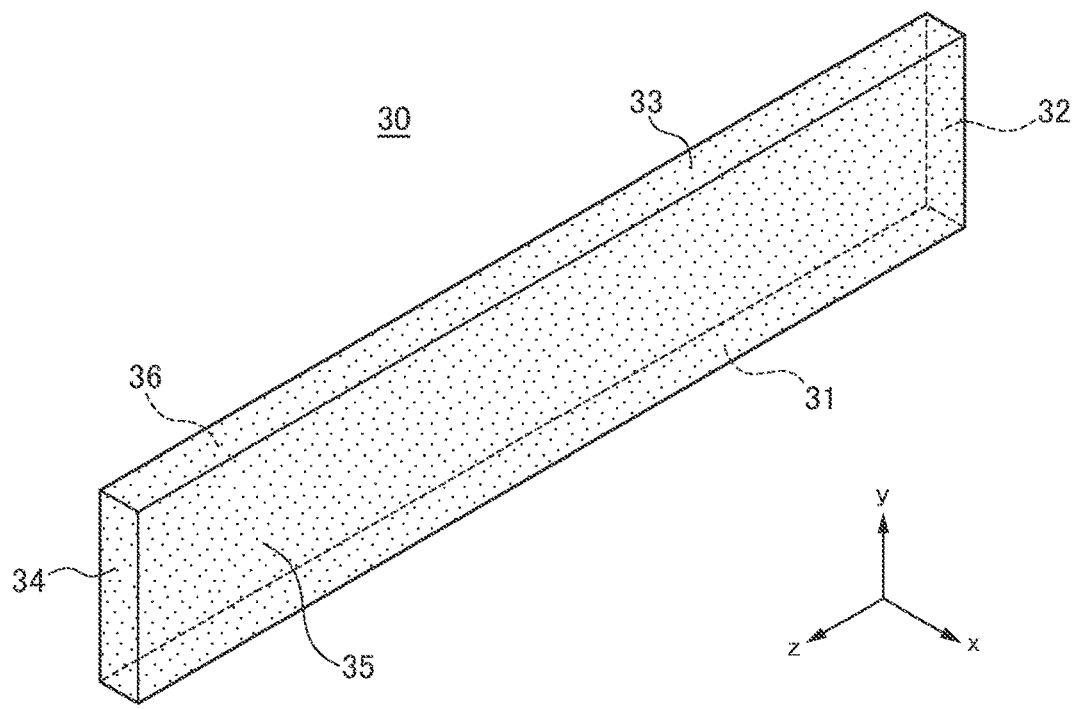
FIG. 4 is a schematic perspective view for explaining the structure of the magnetism collecting member 30.

FIG. 4 is a schematic perspective view for explaining the structure of the magnetism collecting member 30.

As illustrated in FIG. 4, the magnetism collecting member 30 has a substantially rectangular parallelepiped shape with six surfaces 31 to 36. The surface 31 constitutes the xz plane and faces the surface of the substrate 2 in a mounted state. The surface 32 constitutes the xy plane and faces the element formation surface 20a of the sensor chip 20 in a mounted state. The surface 33 constitutes the xz plane and is opposite to the surface 31. The surface 34 constitutes the xy plane and is opposite to the surface 32. The surfaces 35 and 36 constitute the yz plane and opposite to each other.

In the present embodiment, the surfaces 31 and 32 of the magnetism collecting member 30 has higher flatness than that of the other surfaces 33 to 36. For example, the surface roughness Ra of the surfaces 33 to 36 is about 200 nm, while the surface roughness Ra of the surfaces 31 and is about 30 nm. This is the result obtained by selectively applying grinding or polishing to the surfaces 31 and 32 of the magnetism collecting member 30. Applying grinding or polishing to the surfaces 31 and 32 of the magnetism collecting member 30 not only enhances flatness of the surfaces 31 and 32, but also makes the angle formed by the surfaces 31 and 32 closer to 90°. Thus, when the magnetism collecting member 30 is mounted on the substrate 2, the surface 31 tightly contacts the surface of the substrate 2 with substantially no gap, and the surface 32 tightly contacts the element formation surface 20a of the sensor chip 20 with substantially no gap. Thus, it is possible to suppress a reduction in detection sensitivity due to the presence of a gap between the element formation surface 20a and the magnetism collecting member 30 and to reduce variations in detection sensitivity among products.

Figure 5A:
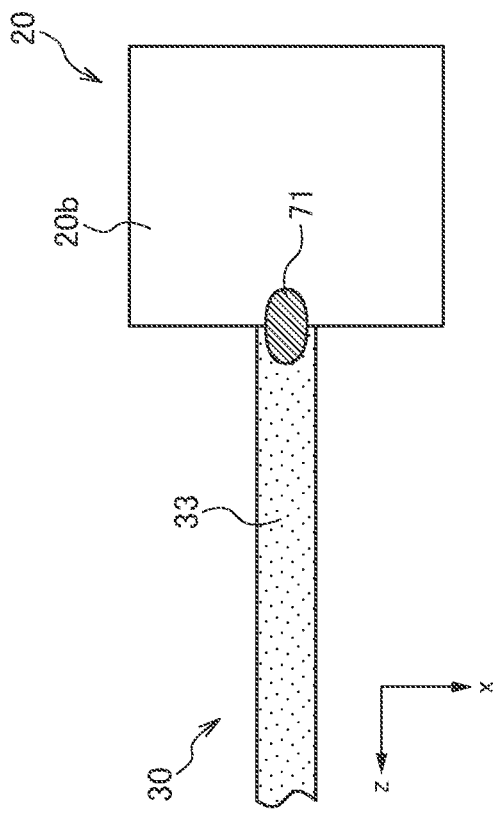
FIGS. 5A to 5C are schematic diagrams for explaining an applying position of adhesives 71 to 73.
Figure 5C:
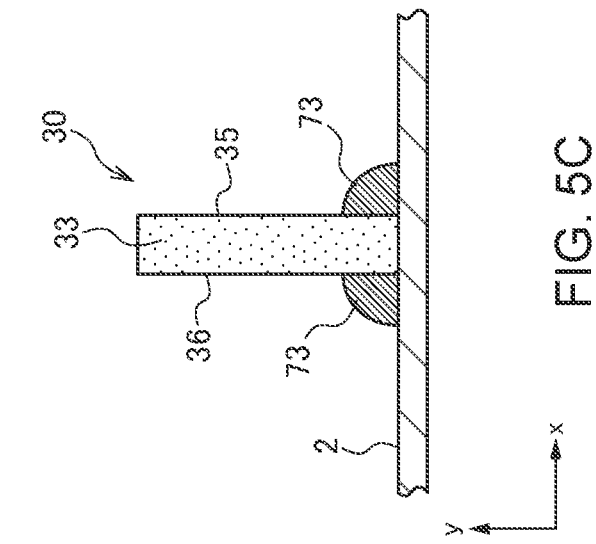
Figure 5B:
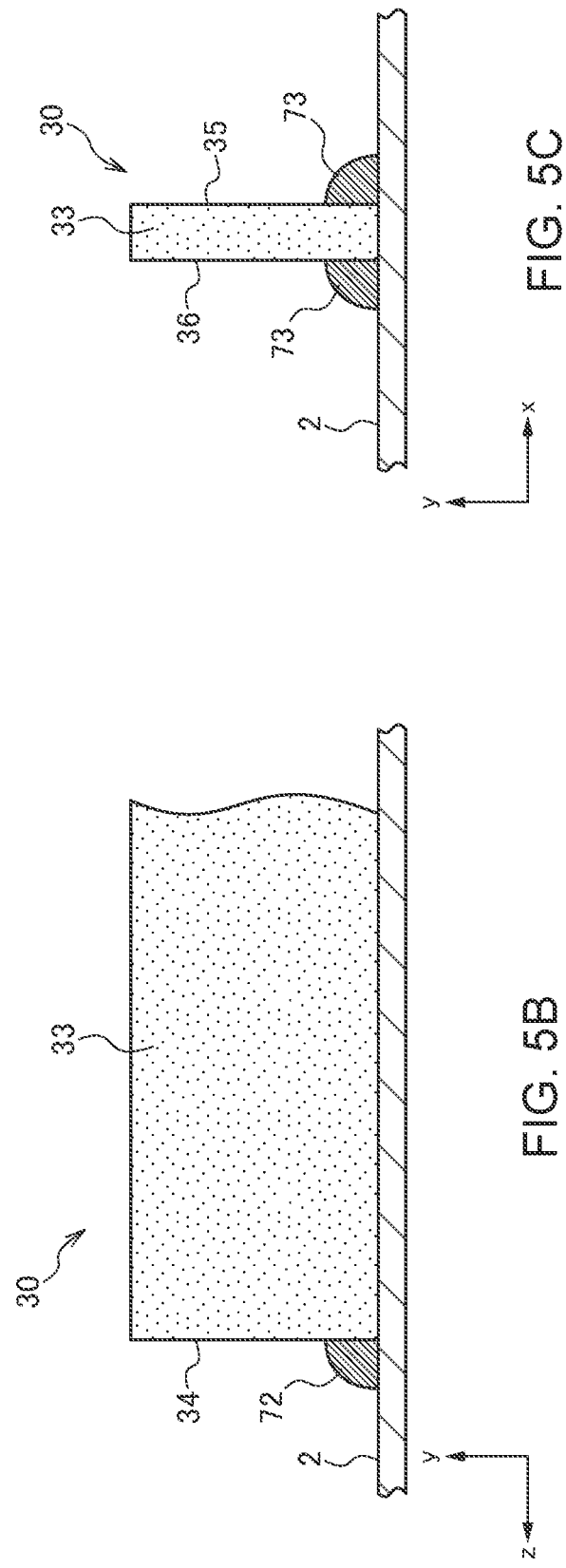

As illustrated in FIGS. 5A to 5C, the magnetism collecting member 30 can be fixed using adhesives 71 to 73. In the example of FIG. 5A, the adhesive 71 is applied over the surface 33 of the magnetism collecting member 30 and the top surface (xz plane) 20b of the sensor chip 20, whereby the relative positional relation between the sensor chip 20 and the magnetism collecting member 30 is fixed. The surface 33 of the magnetism collecting member 30 is preferably rougher than the surfaces 31 and 32. Thus, as compared to when the surface 33 of the magnetism collecting member 30 has flatness equivalent to that of the surfaces 31 and 32, adhesive strength of the adhesive 71 can be enhanced. When the adhesive 71 enters between the surface 32 of the magnetism collecting member 30 and the element formation surface 20a, the gap therebetween may become wider; however, in the present embodiment, flatness of the surface 32 of the magnetism collecting member 30 is high, so that entering of the adhesive 71 due to surface tension is less likely to occur.

In the example illustrated in FIG. 5B, the adhesive is applied over the surface 34 of the magnetism collecting member 30 and the surface of the substrate 2, whereby the relative positional relation between the substrate 2 and the magnetism collecting member 30 is fixed. The surface 34 of the magnetism collecting member 30 is preferably rougher than the surfaces 31 and 32. Thus, as compared to when the surface 34 of the magnetism collecting member 30 has flatness equivalent to that of the surfaces 31 and 32, adhesive strength of the adhesive 72 can be enhanced.

In the example illustrated in FIG. 5C, the adhesive 73 is applied over the surfaces 35 and 36 of the magnetism collecting member 30 and the surface of the substrate 2, whereby the relative positional relation between the substrate 2 and the magnetism collecting member 30 is fixed. The surfaces 35 and 36 of the magnetism collecting member 30 are preferably rougher than the surfaces 31 and 32. Thus, as compared to when the surfaces 35 and 36 of the magnetism collecting member 30 have flatness equivalent to that of the surfaces 31 and 32, adhesive strength of the adhesive 73 can be enhanced.

However, in the present invention, it is not necessary to use all the adhesives 71 to 73; some adhesives (e.g., adhesive 73) may be omitted.

The following describes a manufacturing method for the magnetic sensor 10 according the present embodiment.

Figure 6:
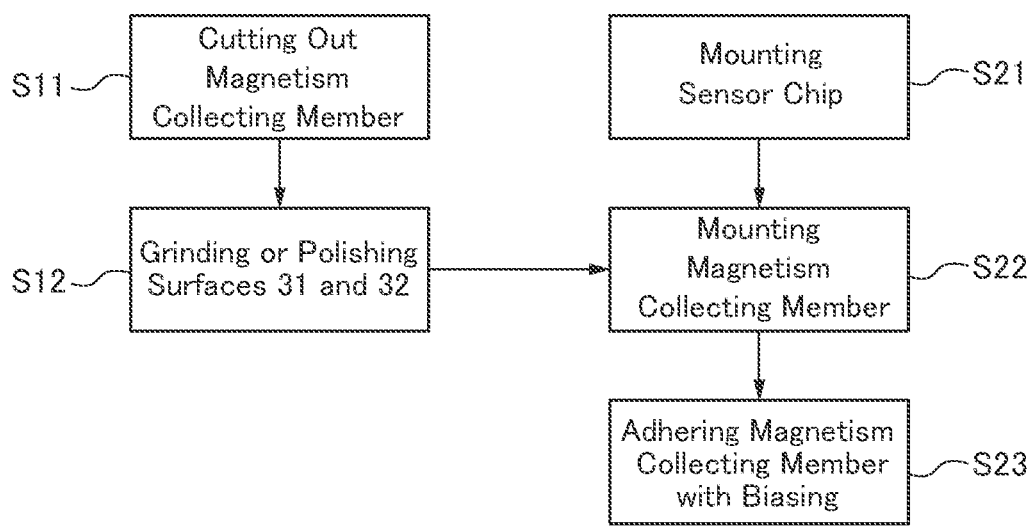
FIG. 6 is a flowchart for explaining a manufacturing process for the magnetic sensor 10 according to the present embodiment.

FIG. 6 is a flowchart for explaining a manufacturing process for the magnetic sensor 10 according to the present embodiment.

First, the magnetism collecting member 30 is cut out from a block made of a magnetic material, such as ferrite (step S11), and then the surfaces 31 and 32 of the magnetism collecting member 30 are ground or polished to enhance flatness of the surfaces 31 and 32 (step S12). Immediately after the magnetism collecting member 30 is cut out, flatness of the surfaces 31 to 36 is low, and accuracy of the angle formed by two adjacent surfaces is also low. However, applying grinding or polishing to the surfaces 31 and 32 of the magnetism collecting member 30 enhances flatness of the surfaces 31 and 32 and makes the angle formed by the surfaces 31 and 32 as close to 90° as possible. The grinding or polishing is not applied to the other surfaces 33 to 36, preventing unnecessary increase in manufacturing cost. However, some of the surfaces 33 to 36 may be subjected to grinding or polishing.

Concurrently with the machining of the magnetism collecting member 30, the sensor chip 20 is mounted on the substrate 2 such that the element formation surface 20a is perpendicular to the substrate 2 (step S21). After that, the machined magnetism collecting member 30 is mounted on the surface of the substrate 2 (step S22). The magnetism collecting member 30 is mounted such that the surfaces 31 and 32 face the surface of the substrate 2, and the element formation surface 20a of the sensor chip 20, respectively. As described above, flatness of the surfaces 31 and 32 of the magnetism collecting member 30 is high, and the angle formed by the surfaces 31 and 32 is made as close to 90° as possible, thereby allowing the surface 32 of the magnetism collecting member 30 to tightly contact the element formation surface 20a of the sensor chip 20 with substantially no gap.

Figure 7:
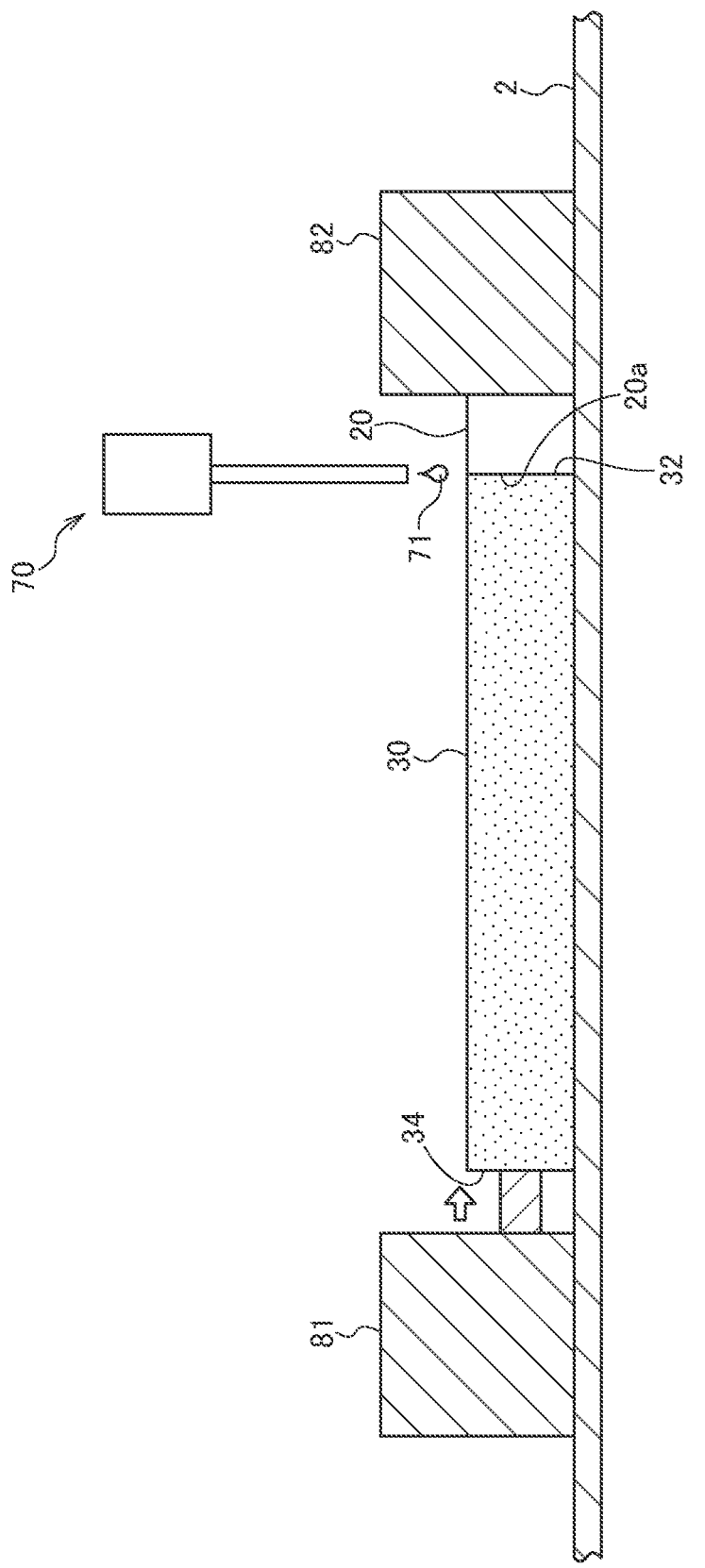
FIG. 7 is a schematic diagram for explaining a method for supplying and curing the adhesive 71 with the magnetism collecting member 30 biased.

Then, the adhesives 71 to 73 are supplied and cured to fix the magnetism collecting member 30 (step S23). At this time, the adhesives are preferably supplied and cured with the magnetism collecting member 30 biased so as to properly press the surface 32 of the magnetism collecting member 30 against the element formation surface 20a of the sensor chip 20. For example, as illustrated in FIG. 7, after the magnetism collecting member 30 is mounted on the substrate 2, the adhesive 71 is supplied from a dispenser 70 in a state where the magnetism collecting member 30 is biased in the −z direction from the surface 34 side with a biasing tool 81. In this case, the back surface side of the sensor chip 20 is preferably supported with a fixing tool 82 so as not to move or bring down the sensor chip 20 in the −z direction. By supplying and curing the adhesive 71 while using the tools 81 and 82, it is possible to keep a state where the surface 32 of the magnetism collecting member 30 is properly pressed against the element formation surface 20a of the sensor chip 20 and to prevent entering of the adhesive 71 between the surface 32 of the magnetism collecting member 30 and the element formation surface 20a of the sensor chip 20.

Similarly, the adhesives 72 and 73 are supplied and cured in a state of being fixed using the tools 81 and 82.

As described above, the magnetic sensor 10 according to the present embodiment, flatness of the surfaces 31 and 32 of the magnetism collecting member 30 is selectively enhanced, thus allowing the surface 32 of the magnetism collecting member 30 to tightly contact the element formation surface 20a of the sensor chip 20. Further, the adhesive 71 is less likely to enter between the surface 32 of the magnetism collecting member 30 and the element formation surface 20a of the sensor chip 20. Moreover, at least some of the other surfaces 33 to 36 are not subjected to grinding or polishing, so that a sufficient adhesive strength of the adhesives 71 to 73 can be ensured.

It is apparent that the present invention is not limited to the above embodiments, but may be modified and changed without departing from the scope and spirit of the invention.

REFERENCE SIGNS LIST 2 substrate
10 magnetic sensor
20 sensor chip
20a element formation surface
20b top surface of sensor chip
21-23 magnetic layer
30, 41, 42 magnetism collecting member
31-36 surface of magnetism collecting member
51-56 terminal electrode
61 differential amplifier
62 detection circuit
70 dispenser
71-73 adhesive
81 biasing tool
82 fixing tool
C compensation coil
OH1, OH2 overhung part
R1-R4 magnetosensitive element

What is claimed is:
1. A magnetic sensor comprising:
a substrate;

a sensor chip including an element formation surface having a magnetosensitive element formed thereon, the sensor chip being mounted on a surface of the substrate such that the element formation surface is perpendicular to the surface of the substrate; and a magnetism collecting member having a first surface and a second surface, the magnetism collecting member being mounted on the surface of the substrate such that the first surface of the magnetism collecting member faces the surface of the substrate and the second surface of the magnetism collecting member faces the element formation surface of the sensor chip, wherein the magnetism collecting member has a third surface opposite the first surface, wherein the sensor chip and the magnetism collecting member are fixed to each other through an adhesive applied on the sensor chip and the third surface of the magnetism collecting member, and wherein the first and second surfaces of the magnetism collecting member have flatness higher than that of the third surface of the magnetism collecting member.

2. The magnetic sensor as claimed in claim 1, wherein the magnetism collecting member is made of a ferrite material.

3. The magnetic sensor as claimed in claim 1, wherein the magnetism collecting member further has a fourth surface opposite the second surface, wherein the substrate and the magnetism collecting member are fixed to each other through an adhesive applied on the surface of the substrate and the fourth surface of the magnetism collecting member, and wherein the flatness of the first and second surfaces is higher than that of the fourth surface.

4. The magnetic sensor as claimed in claim 3, wherein the magnetism collecting member is made of a ferrite material.

5. The magnetic sensor as claimed in claim 3, wherein the magnetism collecting member further has fifth and sixth surfaces opposite to each other and perpendicular to the first to fourth surfaces, and wherein the flatness of the first and second surfaces is higher than that of the fifth and sixth surfaces.

6. The magnetic sensor as claimed in claim 5, wherein the substrate and the magnetism collecting member are fixed to each other through an adhesive applied on the surface of the substrate and the fifth and sixth surfaces of the magnetism collecting member.

7. The magnetic sensor as claimed in claim 1, wherein the magnetism collecting member further has fifth and sixth surfaces opposite to each other and perpendicular to the first and second surfaces, and wherein the flatness of the first and second surfaces is higher than that of the fifth and sixth surfaces.

8. The magnetic sensor as claimed in claim 7, wherein the substrate and the magnetism collecting member are fixed to each other through an adhesive applied on the surface of the substrate and the fifth and sixth surfaces of the magnetism collecting member.

* * * * *